United States Patent
Brunner

(10) Patent No.: US 7,951,301 B2
(45) Date of Patent: May 31, 2011

(54) METHOD FOR PRODUCING A CERAMIC PRINTED-CIRCUIT BOARD

(75) Inventor: Jürgen Brunner, Pölfing-Brunn (AT)

(73) Assignee: EPCOS AG, Munich (DE)

( * ) Notice: Subject to any disclaimer, the term of this patent is extended or adjusted under 35 U.S.C. 154(b) by 766 days.

(21) Appl. No.: 11/630,565

(22) PCT Filed: Jun. 3, 2005

(86) PCT No.: PCT/EP2005/005997
§ 371 (c)(1),
(2), (4) Date: Aug. 24, 2007

(87) PCT Pub. No.: WO2006/000291
PCT Pub. Date: Jan. 5, 2006

(65) Prior Publication Data
US 2008/0283488 A1    Nov. 20, 2008

(30) Foreign Application Priority Data
Jun. 25, 2004   (DE) .......................... 10 2004 030 800

(51) Int. Cl.
*H01B 13/00* (2006.01)
(52) U.S. Cl. ........................................ 216/13; 427/97.1
(58) Field of Classification Search .................. 216/13; 427/97.1, 99.5
See application file for complete search history.

(56) References Cited

U.S. PATENT DOCUMENTS

| | | | |
|---|---|---|---|
| 4,812,202 A * | 3/1989 | Bogenschutz et al. | 427/307 |
| 5,206,055 A | 4/1993 | Iacovangelo | |
| 6,281,090 B1 | 8/2001 | Kukanskis et al. | |
| 6,419,980 B1 * | 7/2002 | Auerswald | 427/97.4 |
| 2002/0137256 A1 | 9/2002 | Knickerbocker et al. | |
| 2003/0151141 A1 | 8/2003 | Matsuki et al. | |
| 2004/0018308 A1 * | 1/2004 | Kanzler | 427/304 |
| 2004/0057485 A1 | 3/2004 | Ohki et al. | |

FOREIGN PATENT DOCUMENTS

| | | |
|---|---|---|
| CN | 1376020 | 10/2002 |
| CN | 1439174 | 8/2003 |
| DE | 24 43 287 | 3/1976 |
| DE | 19833593 A1 * | 1/2000 |
| DE | 44 31 847 | 8/2002 |
| EP | 0 884 935 | 12/1998 |
| EP | 1 102 523 | 5/2001 |
| EP | 1 298 968 | 4/2003 |
| GB | 1 485 569 | 9/1977 |
| JP | 03060186 | 3/1991 |
| JP | 8-153949 | 6/1996 |
| JP | 2508848 | 6/1996 |
| JP | 2002-050715 | 2/2002 |
| JP | 2002-208775 | 7/2002 |
| JP | 2004-055624 | 2/2004 |
| JP | 2004-115913 | 4/2004 |
| JP | 2005-068489 | 3/2005 |
| JP | 2005068489 A * | 3/2005 |

OTHER PUBLICATIONS

English translation of the Written Opinion for PCT/EP2005/005997.
Examination Report from corresponding application CN 200580021114.3.
International Search Report for PCT/DE2005/005997.
Written Opinion for PCT/DE2005/005997.
Charles A Harper 'High Performance Printed Circuit Boards Advanced Ceramic Substrates for Microelectronic Systems, 2000 Mc-Graw Hill, USA, XP-002339276.
English translation of Examination Report dated Oct. 22, 2010 received in corresponding application JP 2007-517119.

* cited by examiner

*Primary Examiner* — Roberts Culbert
(74) *Attorney, Agent, or Firm* — Fish & Richardson P.C.

(57) ABSTRACT

A method produces of a ceramic circuit board that has a ceramic substrate on a top side of the circuit board, solderable contact pads for components, and solderable contacts on an underside of the circuit board. The metallization for the solderable contact pads is produced by depositing a metal from a solution directly onto the ceramic substrate.

10 Claims, 2 Drawing Sheets

METHOD FOR PRODUCING A CERAMIC PRINTED-CIRCUIT BOARD

BACKGROUND

Currently ceramic substrates are used as substrates for modules and as system carriers for whole circuit architectures that replace the plastic circuit boards. Ceramic substrates have the advantage that they are mechanically stable, are produced by micromechanical structuring techniques and also can be mounted with un-housed components. In addition, ceramic, multilayer substrates are known, for which metallization planes, in which passive components and wiring structures can be implemented by structuring, are provided between dielectric, ceramic layers. In addition, methods are known for encapsulating ceramic module or system carriers hermetically with the components applied thereon. Due to the high density of the ceramic substrates, these encapsulated modules have a high imperviousness with respect to gases and moisture.

The mounting of components onto ceramic substrates can take place by different bonding techniques. For example, SMD-methods, flip-chip arrays and wire bond techniques are known. The two latter methods can be implemented with unhoused components, so-called "bare dies." In both cases, it is necessary to make available bondable metallic surfaces on the ceramic substrate. For populating the ceramic substrate with the components in a high speed automation system within a production line, strict requirements are placed on the smoothness of the bond surface. The problem in this case is that the bond surfaces used heretofore for ceramic substrates do not satisfy these requirements. Formerly, bond surfaces were produced by silk-screening techniques with metal-containing pastes and burn-in of these pastes, which results in rough surfaces. Together with the ceramic portion of these printed bond surfaces, the adhesion strength of bond wires or of bumps bonded thereon is reduced. The result is that either the mounting speed is reduced or deficiencies with regard to the durability of the resultant bond connection have to be taken into account.

SUMMARY

Described herein is a method for producing ceramic circuit boards.

This patent application describes producing a ceramic circuit board without requiring printing-on of metal-containing pastes, and wherein metallization for the bond surfaces is deposited directly from a solution onto the ceramic substrate.

In this manner it is possible to produce a surface having very good conductivity and adhesion as well as very good bonding properties. Moreover, the roughness of solderable connecting surfaces produced in this manner is reduced in comparison to known surfaces. An additional advantage is that by direct deposition of metal, more precise metal structures can be created on the ceramic substrate, so that thin and randomly structured circuit paths can also be produced, as well as bond surfaces. The method can be fully integrated and carried out in a highly automated manner, and does not require longer process times in comparison to the printing of circuit paths.

The method is suitable in particular for the production of solderable connecting surfaces on the top side of LTCC (low temperature co-fired ceramic) panels that can contain wiring structures and passive components integrated within the multiple layer LTCC ceramic. With this method, connecting surfaces can be obtained whose surface roughness is reduced in comparison to the LTCC surface. However, the method described herein can also be used for all other single layer or multiple layer ceramic substrates of different ceramic systems, e.g., for HTCC (high temperature co-fired ceramic).

Structuring the metallization step by a photolithographic technique for the solderable connecting surfaces is also within the scope of the method described herein. This technique can be implemented with high precision and allows the production of precise circuit structures. In addition, by using photolithographic methods, small spacing can be maintained with respect to the metallic structures to be isolated, without any danger of short circuits. Thus it is possible to optimize and to minimize the surface requirements for metallization. In this manner the size of the components, or rather that of the modules and systems formed on the ceramic substrate, can be reduced.

An additional advantage of the photolithographic structuring is that the metallization structures produced in this manner have a defined cross-sectional shape, since they have defined edge angles and a particularly smooth and thus highly bondable surface, in comparison to the printed metallization.

The production of the metallization surface can take place in several steps. For example, first a full-surface base metallization is applied directly onto the substrate. In the next step, the base metallization can be structured, and the referenced photolithography method is may be used. Of course, it is also possible to perform the structuring directly, for example, by removal using a laser, by mechanical removal or by application of an etching mask using a printing method. In those cases, the base metallization will be removed from the sites not intended for the connecting surfaces, and possibly also the conductors. Next, a reinforcing layer is deposited, which subsequently can be finished with a bondable surface by deposition of a bondable layer, on the structured base metallization. All metal depositions take place from metal-containing solutions and can be applied galvanically or currentlessly. A currentless deposition of a metal with good adhesion and homogeneous deposition properties may be used for the base metallization, for example, a currentless deposition of a copper layer. Then if a solid metal layer is created, it can be galvanically reinforced, for example, also by using copper.

Then once the base metallization layer is produced in this manner at a structurable layer thickness, the structuring of the base metallization layer itself will proceed. In this case, the desired metallization structure, having the desired, solderable connecting surfaces and other conducting structures, is obtained and it can be selectively reinforced in subsequent steps. This can take place by currentless methods that are suitable for selective metal deposition onto already metalized surfaces.

However, it is also possible in a first process step, to produce a cohesive metal layer with a relatively thin base metallization, and subsequently to apply a negative mask of the desired, future metallization thereon. The latter may be a mask produced by photolithography that is applied at a thickness that corresponds to the desired overall height of the metalized layer. After structuring of the mask, e.g., a photoresist, the regions of the base metallization intended for the structuring are exposed and can be reinforced to a desired layer thickness galvanically or currentlessly.

Next, the mask and the regions of the base metallization layer located underneath can also be removed. The advantage of this implementation is that the metallization can be created with any particular, steep edge angle. In this regard, only the edge angle at which the mask can be produced, is a limiting factor. The edge angle is then no longer dependent on the anisotropy of the etching process in the structuring of the solid, base metallization layer, and also does not produce any underetching or slanting edges. For this embodiment, it is merely necessary in the final step after removal of the resist mask, to provide a corrosion-resistant and bondable surface, which can be assured through subsequent application of corresponding metal layers onto the already structured metallization layer.

A nickel layer as a reinforcing film, in particular, is suitable for application onto a base-metallization layer of copper; the nickel can be deposited selectively onto the copper layer in a currentless manner.

For additional reinforcement, a palladium layer can also be applied selectively onto the nickel layer, again using a currentless method. The bondable surface, in turn, is created by chemical deposition of the referenced palladium layer and by depositing a relatively thin gold layer thereon. The gold layer is chemically inert and provides a bondable surface.

In an additional elaboration of the method, the ceramic substrate and in particular the LTCC panel is cleaned before the creation of the metallization layer, for which purpose a sandblasting step can be used, for example.

Before the first currentless deposition of a metallization layer, a chemical activation of the surface is necessary in order to make the currentless deposition possible at all. This step can be implemented with a known activation solution containing palladium, for instance.

For structuring the base metallization layer, in particular for structuring of a copper layer used as base metallization layer, a solution containing iron(III) ions may be used, for example, an aqueous solution containing iron(III) chloride. This leads to an essentially isotropic etching of the base metallization layer, so that edge angles that in the worst case will amount to 45° are obtained due to the structuring. With a suitable technology and in particular a directed control of the etching solution, it is possible to obtain even steeper edge angles during etching of the base metallization layer. The subsequent galvanic or currentless deposition processes result in a conformal metal deposition, in which existing structures and angles are uniformly thickened. In this case, edge angles are retained as also are the flat top sides of the metallization layer.

The method will be explained in greater detail below based on embodiments and with respect to the associated figures. The figures are intended solely to impart a better understanding and are illustrated only schematically and not true-to-scale. The same parts are designated with the same reference numbers.

DETAILED DESCRIPTION

Figure 1:
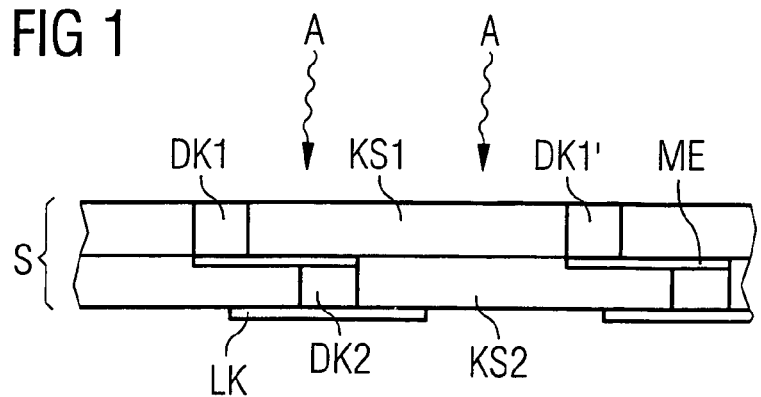
FIGS. 1 to 5 show different process steps in the production of solderable connecting surfaces based on schematic cross sections through the substrate and the metallization layer.

FIG. 1 shows a ceramic substrate—based on a schematic cross section—and two ceramic layers KS1, KS2 illustrated therein. The electrical connection of the top side of the substrate to the lower side takes place by interlayer connections DK1, DK2, with a metallization plane ME that can be structured circuit paths, circuit structures or circuit elements formed between the ceramic layers. There are solderable contacts provided on the underside of the substrate. However, it is also possible to produce the solderable contacts LK together with the solderable connecting surface in the same method. In the first step of the manufacture of a metallization layer on the surface of the substrate, the substrate is cleaned by a sandblasting method and a subsequent activation, both indicated in the figure by the arrow A. During the activation, the substrate surface is treated with a palladium-containing solution, for example, a palladium chloride solution. In this case, palladium atoms that catalyze the subsequent metallization layer are deposited onto the surface of the substrate.

Figure 2:
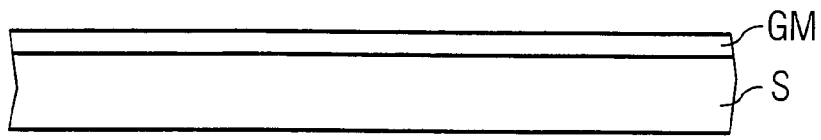

In the next step, a base metallization layer GM is created on the activated surface, by the deposition of a full-surface copper layer. This can take place in two steps, where first a relatively thin copper layer is deposited in a currentless manner, which is then galvanically reinforced up to the desired thickness of 5 µm, for example. FIG. 2 shows the substrate S with the base metallization layer GM. For simplicity in the illustration, the interlayer connections and the other structures present in the substrate were omitted.

Figure 3:
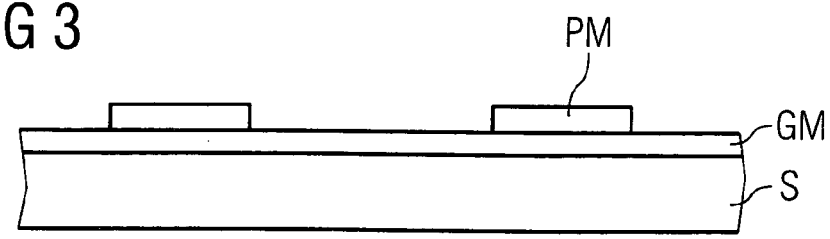

For structuring the base metallization layer, a photoresist mask PM is applied in the next step, and is exposed and developed corresponding to the desired pattern for the metallization. The regions of the photoresist mask PM not intended for metallization remain uncovered. FIG. 3 shows the configuration in this process step.

Figure 4:
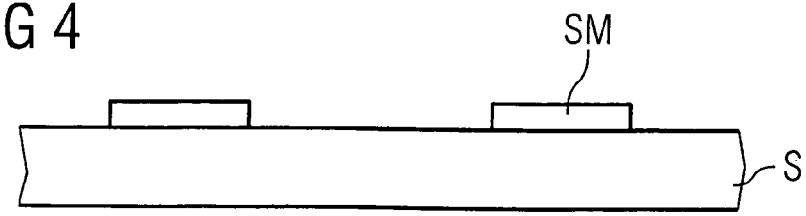

Then with the photoresist mask PM, the base metallization layer GM is etched, and the etching agent is selected as a function of the material used for the base metallization GM. For a copper layer, an aqueous solution containing iron(III) ions has proven useful. Other etching agents are also possible, for example, nitric acid $HNO_3$. In the regions not covered by the photoresist mask, the base metallization layer will be removed down to the substrate. Next, the photoresist mask is removed, for example, with a solvent. FIG. 4 shows the configuration with the base metallization SM already structured on the surface of the substrate.

Figure 5:
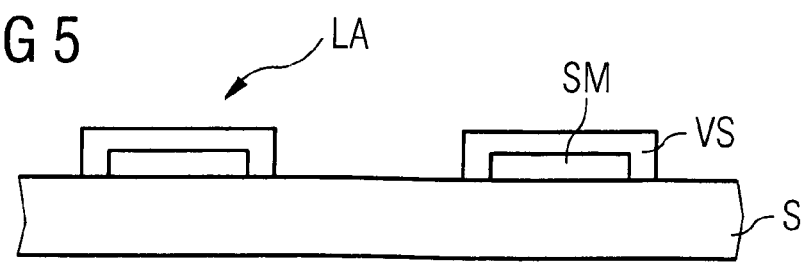
Figure 6:
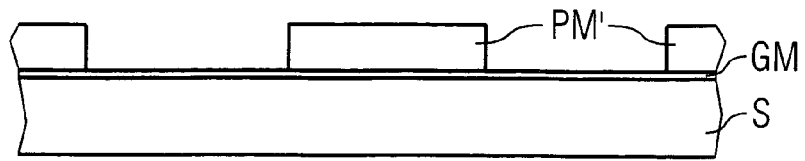
FIGS. 6 to 9 show different process steps of a second embodiment of the process.

In the next step, the base metallization layer is reinforced. For doing this, a currentless method, in particular, is suitable so that metal can be deposited specifically onto the already existing metal structures SM, so that these structures can be reinforced. In one embodiment, first a nickel layer of about 5 µm thickness is applied onto the structured, base metallization layer SM. Then a currentless deposition of a roughly 2 µm-thick palladium layer follows. Next, current is applied through an 0.2 µm thick gold layer in order to provide the metallization layer with a bondable surface. FIG. 5 shows the structured metallization SM equipped here with a reinforcing layer VS formed as a triple layer. Thus, the solderable connecting surfaces having a smooth, solderable and bondable structure, which are shielded against corrosion on all sides and have a defined edge angle to the substrate S, are produced.

Figure 7:
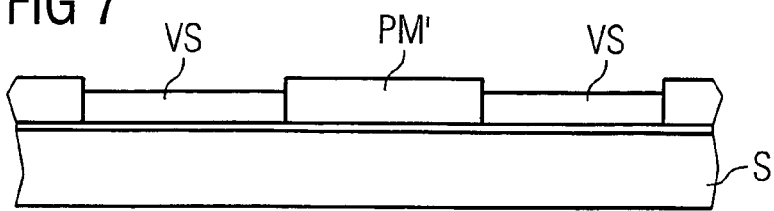

According to a second embodiment, a thin base metallization layer GM is first created on the surface of the substrate after the activation, for example, a thin copper layer 50 nm to 1 µm thick. A full-surface photoresist layer is applied onto the base metallization; this layer is then exposed image-wise and developed, with the regions of the base metallization layer GM intended for subsequent metallization remaining open. In these regions not covered by the photomask PM, the base metallization GM can now be reinforced by a galvanic or currentless method, with the photomask PM being used as a mold for growing of the metalized layer VS. In this manner, a reinforced layer VS can be created up to a desired layer thickness. FIG. 7 shows the configuration after this process step.

Figure 8:
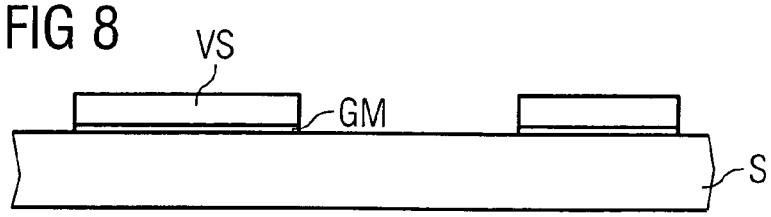

Next, the photomask PM is removed and an etching step carried out, until the base metallization layer GM at the regions formerly covered by the photomask PM is removed down to the substrate. This procedure takes into account that a corresponding layer thickness is also removed from the surface of the reinforced layer VS. This shrinkage is taken into account both in the structuring of the photomask PM and also in the total applied thickness of the metal layers. FIG. 8 shows the configuration with the reinforced metallization layer produced in this manner.

Figure 9:
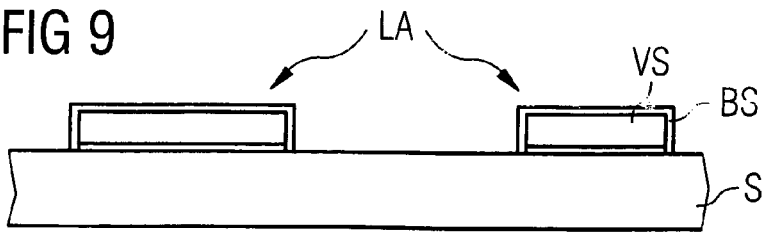

As a final step, a corrosion-resistant layer, and in particular a bondable layer BS are applied onto the metallization layer consisting of the base metallization layer GM and the reinforcing layer VS. This can take place, if necessary, in a multistep process using currentless deposition from a metal-containing solution. FIG. 9 shows the configuration with the solderable connection surfaces LA produced in this manner.

In the same way, the solderable contacts LK can be produced on the underside of the substrate in parallel or in a subsequent process step. Subsequently, the ceramic substrate, for example, the LTCC circuit board, is ready for mounting-on components.

Figure 10:
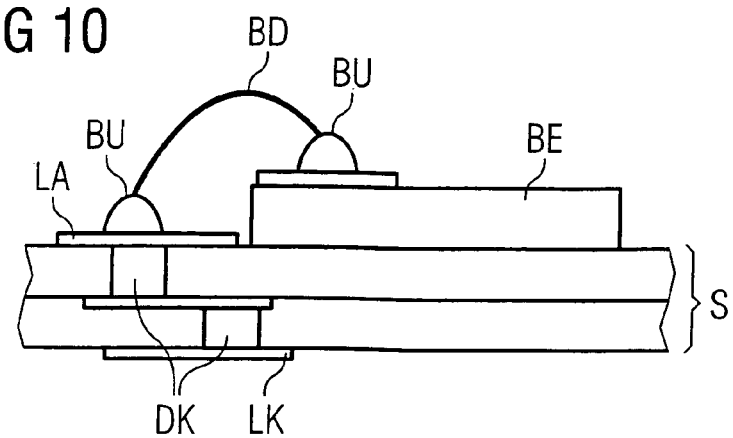
FIG. 10 shows a ceramic substrate with a component bonded thereon.

FIG. 10 shows a ceramic substrate S, whose solderable connecting surfaces LA were produced on the top side of the substrate with a method described herein that is populated with a component BE. Whereas the component BE is glued on, for example, the electric connection is joined by a bond wire BD between the solderable connecting surface LA and a metallization layer on the surface of the component. During the bonding process, one bump BU is produced on each of the two metallizations. Due to the low roughness of the solderable connecting surfaces LA and the bondable surface of the solderable connecting surfaces, the bump joint and the bonding of the bond wires can be implemented at a high speed and with a high adhesion strength by highly automated and fast component-placement robots. Therefore, a ceramic substrate with a solderable connecting surface produced according to a method described herein is improved significantly with respect to a known ceramic substrate with printed connecting surfaces and is particularly suitable for the fast placement robots for the manufacture of bond connections.

What is claimed is:

1. A method for producing a circuit board comprised of a ceramic substrate comprising, on a top side thereof, solderable contact pads for contacting components, the ceramic substrate comprising solderable contact pads on an underside thereof, the ceramic substrate comprising ceramic layers, the ceramic layers comprising interlayer interconnections between solderable contact pads on the top side and the underside, the method comprising:
   depositing a metal from a solution directly onto the ceramic substrate to produce a base metallization layer for solderable contacts pads;
   structuring the base metallization layer to produce a structured base metallization layer;
   depositing a reinforcing layer above the structured base metallization layer; and
   applying a bondable layer above the reinforcing layer;
   wherein depositing the metal comprises:
      depositing a copper layer above the top side of the ceramic substrate; and
      reinforcing the copper layer galvanically;
      wherein reinforcing the copper layer comprises:
         depositing a nickel layer above the copper layer; and
         applying a palladium layer above the nickel layer by chemical deposition.

2. The method of claim 1, wherein the ceramic substrate comprises a low temperature co-fired ceramic.

3. The method of claim 1, wherein the base metallization layer is structured using photolithography.

4. The method of claim 1, further comprising:
   applying a gold layer above the palladium layer.

5. The method of claim 1, wherein structuring is performed using $HNO_3$ or a solution containing aqueous Fe(III) ions.

6. The method of claim 1, further comprising cleaning the ceramic substrate before depositing the metal.

7. The method of claim 6, wherein cleaning is performed by sandblasting.

8. The method of claim 1, wherein structuring the base metallization layer comprises:
   applying a photoresist layer to the base metallization layer, and exposing the photoresist layer to produce a photoresist mask; and
   removing, by etching, one or more regions of the base metallization layer that are not covered by the photoresist mask.

9. The method of claim 8, wherein etching is performed using $HNO_3$ or a solution containing aqueous Fe(III) ions.

10. The method of claim 8, wherein the ceramic substrate comprises a low temperature co-fired ceramic.

* * * * *